(12) United States Patent
Jensen et al.

(10) Patent No.: US 8,684,554 B2
(45) Date of Patent: Apr. 1, 2014

(54) SOLAR ASSEMBLY HAVING REMOVABLE SOLAR PANEL

(75) Inventors: William Mark Jensen, St. Louis, MO (US); Heath A. Doty, St. Louis, MO (US)

(73) Assignee: Jensen Group, LLC, St. Louis, MO (US)

( * ) Notice: Subject to any disclaimer, the term of this patent is extended or adjusted under 35 U.S.C. 154(b) by 276 days.

(21) Appl. No.: 13/315,512

(22) Filed: Dec. 9, 2011

(65) Prior Publication Data
US 2012/0155067 A1 Jun. 21, 2012

Related U.S. Application Data

(60) Provisional application No. 61/425,437, filed on Dec. 21, 2010.

(51) Int. Cl.
*F21L 13/00* (2006.01)

(52) U.S. Cl.
USPC ............ 362/183; 362/227; 362/234; 362/235

(58) Field of Classification Search
USPC .......................... 362/183, 184, 227, 234, 235
See application file for complete search history.

(56) References Cited

U.S. PATENT DOCUMENTS

| | | | |
|---|---|---|---|
| 6,573,659 B2* | 6/2003 | Toma et al. | 315/149 |
| 7,524,079 B2* | 4/2009 | Greenhoe | 362/183 |

* cited by examiner

*Primary Examiner* — Vip Patel
(74) *Attorney, Agent, or Firm* — Dean Small; The Small Patent Law Group LLC

(57) ABSTRACT

A solar assembly includes a base and at least one LED coupled to the base. An illumination panel having a first end and a second end is provided. The first end is coupled to the base. The illumination panel extends from the base between the first end and the second. The illumination panel reflects light emitted from the at least one LED. A solar panel receptacle is positioned at the second end of the illumination panel. A solar panel housing is removably attached to the solar panel receptacle. The solar panel housing has a solar panel to power the at least one LED.

20 Claims, 7 Drawing Sheets

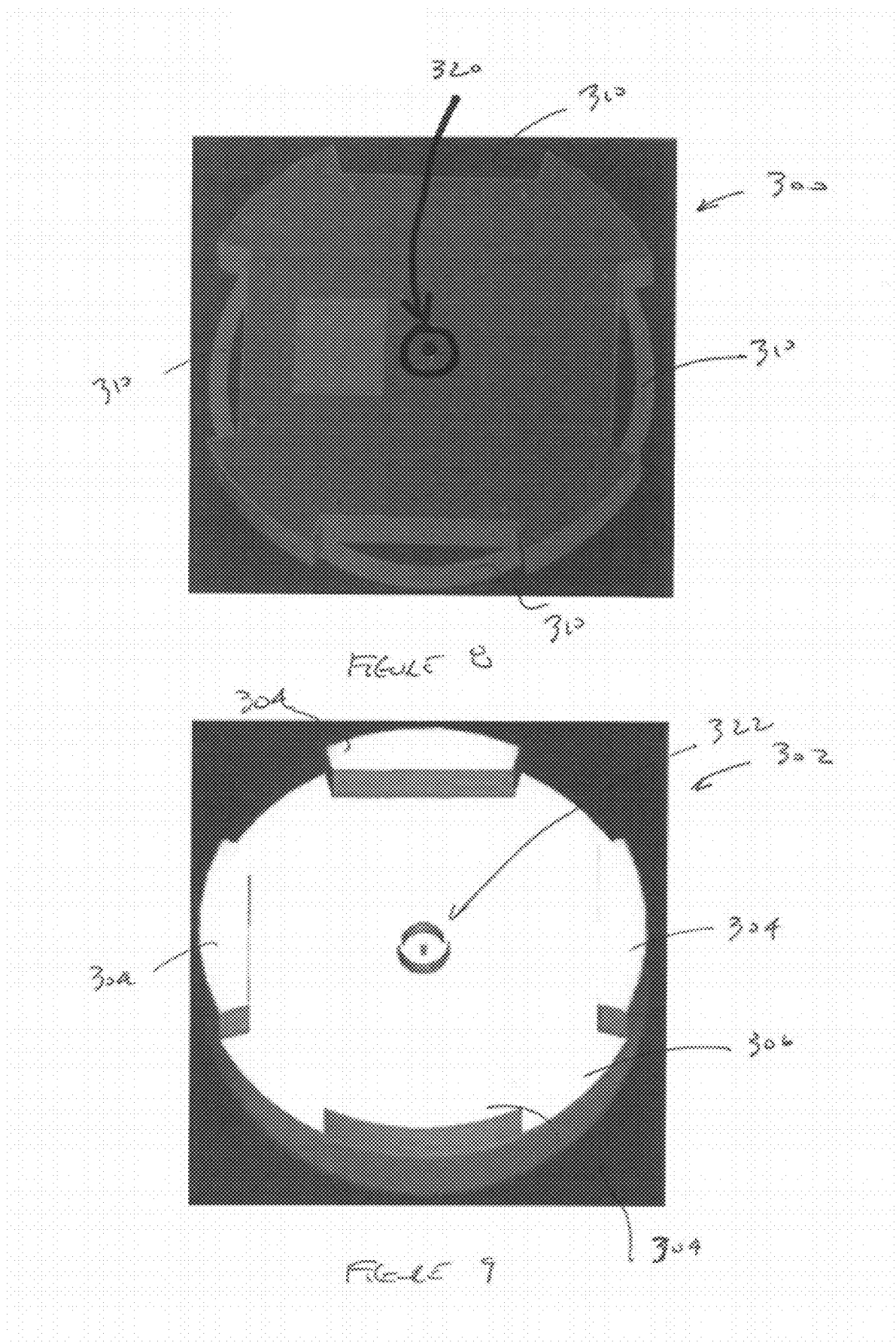

SOLAR ASSEMBLY HAVING REMOVABLE SOLAR PANEL

CROSS-REFERENCE TO RELATED APPLICATIONS

This application claims priority benefit to U.S. Provisional Application No. 61/425,437 which was filed on Dec. 21, 2010 and is titled "Solar Assembly Having Removable Solar Panel" (the "437 application"). The entire disclosure of the '437 application is incorporated by reference herein.

BACKGROUND OF THE INVENTION

The embodiments described herein relate to solar assemblies, and more particularly, to a solar assembly having a removable solar panel.

Solar assemblies generally include a solar panel configured to generate power for a light source within the assembly. The solar panel generates electrical energy from solar energy. The solar panel is electrically coupled to a battery that stores the electrical energy generated by the solar panel. The solar panel is configured to be positioned within sunlight to generate the electrical energy that charges the battery. The electrical energy stored in the battery is utilized to illuminate the light source within the solar assembly.

However, conventional solar assemblies are not without their disadvantages. Conventional solar assemblies include solar panels that are permanently attached to the light source. Accordingly, the solar assembly is limited to outdoor use because the solar panel must be positioned within sunlight. If a solar assembly is used in an area that does not receive sunlight, for example, on a covered porch or indoors, the battery will lose its charge and the solar assembly will become non-operational. To recharge the battery, the entire solar assembly must be moved into the sunlight for an extended period of time. Accordingly, a user is required to frequently move the entire solar assembly from the indoor environment and into the sunlight. Frequently moving the entire solar assembly is impractical and time consuming.

A need remains for a solar assembly having a solar panel that can be recharged without frequently moving the entire solar assembly.

SUMMARY OF THE INVENTION

In one embodiment, a solar assembly is provided. The solar assembly includes a base and at least one LED coupled to the base. An illumination panel having a first end and a second end is provided. The first end is coupled to the base. The illumination panel extends from the base between the first end and the second. The illumination panel reflects light emitted from the at least one LED. A solar panel receptacle is positioned at the second end of the illumination panel. A solar panel housing is removably attached to the solar panel receptacle. The solar panel housing has a solar panel to power the at least one LED.

In another embodiment, a solar assembly is provided having a base configured to be coupled to a stand. A globe extends from the base. The globe has a first end joined to the base and a second end positioned distally from the base. A solar panel receptacle is coupled to the second end of the globe so that the globe defines a cavity between the base and the solar panel receptacle. At least one LED is coupled to the base within the cavity. The at least one LED is configured to direct light into the cavity. A solar panel housing is removably attached to the solar panel receptacle. The solar panel housing has a solar panel to power the at least one LED.

In another embodiment, a solar powered lamp is provided having a stand. A base is provided having a top and a bottom. The bottom of the base coupled to the stand. An illumination panel is provided having a first end and a second end. The first end is coupled to the top of the base. At least one LED is positioned on the top of the base. The illumination panel reflects light from the at least one LED. A solar panel receptacle is coupled to the second end of the illumination panel. A solar panel housing is removably attached to the solar panel receptacle. The solar panel housing has a solar panel to power the at least one LED.

BRIEF DESCRIPTION OF THE DRAWINGS

The presently disclosed subject matter will be better understood from reading the following description of non-limiting embodiments, with reference to the attached drawings, wherein below:

FIG. 8 is a top perspective view of another solar panel housing formed in accordance with an embodiment.

FIG. 9 is a top perspective view of a solar panel receptacle that may be utilized with the solar panel housing shown in FIG. 8.

DETAILED DESCRIPTION OF THE INVENTION

Figure 1:
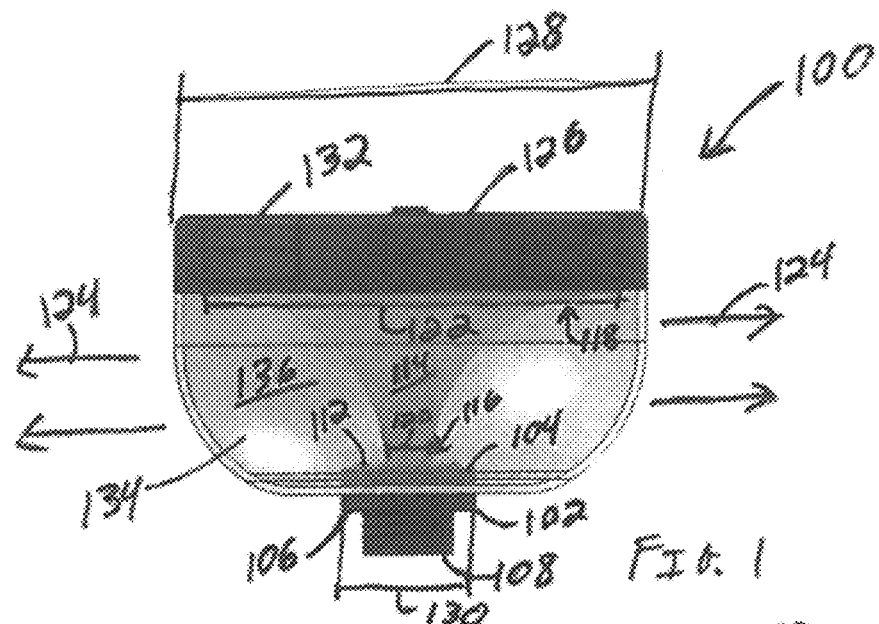
FIG. 1 is a side view of a solar assembly formed in accordance with an embodiment.

The foregoing summary, as well as the following detailed description of certain embodiments, will be better understood when read in conjunction with the appended drawings. It should be understood that the various embodiments are not limited to the arrangements and instrumentality shown in the drawings. As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments provide a solar assembly having a removable solar panel housing including a solar panel and battery. The solar panel housing is removable so that the solar panel may be positioned in sunlight remotely from the remainder of the solar assembly. Accordingly, the solar assembly may be positioned indoors, away from sunlight, while the battery is recharged in direct sunlight. The various embodiments enable the battery to be recharged without having to move the entire solar assembly. The solar assembly may also be provided with multiple solar panel housings so that one solar panel housing can be recharged while a second solar panel housing is utilized to operate the solar assembly. In one embodiment, a table lamp may be purchased for a patio along with a light stand and LED module for use near a barbeque. The solar panel housing may be removed from the lamp and inserted into the barbeque lamp. In other embodiments, a light stand may be provided for camping and/or inside a tent. The solar panel housing may be moved between the two light stands.

FIG. 1 is a side view of a solar assembly 100 formed in accordance with an embodiment. The solar assembly 100 is configured for indoor or outdoor use. The solar assembly 100 includes removable parts that enable a portion of the solar assembly 100 to be positioned outdoors without moving the entire solar assembly 100 outdoors. Accordingly, a portion of the solar assembly 100 may be recharged in sunlight, while the remainder of the solar assembly 100 remains indoors. When used outdoors, the solar assembly 100 recharges without removing any parts therefrom.

The solar assembly 100 includes a base 102 having a top 104 and a bottom 106. A post 108 extends from the bottom 106 of the base 102. The post 108 is threaded to couple the base 102 to a stand 110 (shown in FIG. 6). In the illustrated embodiment, the post 108 is configured to be screwed into the stand 110. Alternatively, the post 108 may include any suitable coupling mechanism to couple to the stand 110. For example, the post 108 may include latches and/or pins that engage corresponding coupling mechanisms on the stand 110. The top 104 of the base 102 includes a plurality of LEDs 112. The LEDs 112 face outward from the top 104 of the base 102. The LEDs 112 are configured to direct light from the top 104 of the base 102. The base 102 may be configured with any number of LEDs 112. The LEDs 112 may be configured to emit either cool white or warm white light. Optionally, the LEDs 112 may be coated with a substance, for example, phosphor or the like, to produce light having color. In one embodiment, the base 102 may include LEDs 112 that are configured to produce different colored light. In such an embodiment, the solar assembly 100 may include a switch or the like to select a desired color of light.

An illumination panel 114 extends from the top 104 of the base 102. The illumination panel 114 may be formed from a reflective material, for example, foil. Alternatively, the illumination panel 114 may be coated with a reflective material and/or chemical. The illumination panel 114 includes a first end 116 and a second end 118. The first end 116 of the illumination panel 114 is joined to the top 104 of the base 102. The first end 116 of the illumination panel 114 includes a first diameter 120 and the second end 118 of the illumination panel 114 includes a second diameter 122. In the illustrated embodiment, the second diameter 122 is greater than the first diameter 120. In the illustrated embodiment, the illumination panel 114 has a parabolic shape. The illumination panel 114 is configured to reflect the light emitted from the plurality of LEDs 112. The illumination panel 114 directs the light outward in the direction of arrows 124. In alternative embodiments, the illumination panel 114 may have any shape configured to direct the light in any desired direction. For example, the illumination panel 114 may be configured to direct the light downward and/or upward.

A solar panel receptacle 126 is positioned at the second end 118 of the illumination panel 114. The illumination panel 114 extends between the base 102 and the solar panel receptacle 126. In the illustrated embodiment, the solar panel receptacle 126 has a width 128. The base 102 has a width 130. The width 128 of the solar panel receptacle 126 is greater than the width 130 of the base 102. The width 128 of the solar panel receptacle 126 may be less than or equal to the width 130 of the base 102, in alternative embodiments. The solar panel receptacle 126 removably retains a solar panel housing 132. In one embodiment, the solar panel receptacle 126 may be removable to enable access to the LEDs 112 for repair and/or replacement.

A globe 134 extends from the base 102 to the solar panel receptacle 126. The globe 134 may be formed from glass, plastic, and/or any other suitable material for allowing light to pass therethrough. The globe 134 defines a cavity 136 between the base 102 and the solar panel receptacle 126. The globe 134 is positioned around the illumination panel 114 and the plurality of LEDs 112. The illumination panel 114 and the plurality of LEDs 112 are positioned within the cavity 136. The LEDs 112 emit light into the cavity 136. The illumination panel 114 reflects the light through the cavity 136 and through the globe 134. The globe 134 may be transparent to allow the light to pass therethrough. Alternatively, the globe 134 may restrict some of the light from passing therethrough. In another embodiment, the globe 134 may be coated with a substance, for example, phosphor or the like, that alters the color of the light. In one embodiment, the globe 134 may be removable to enable access to the LEDs 112 for repair and/or replacement.

Figure 2:
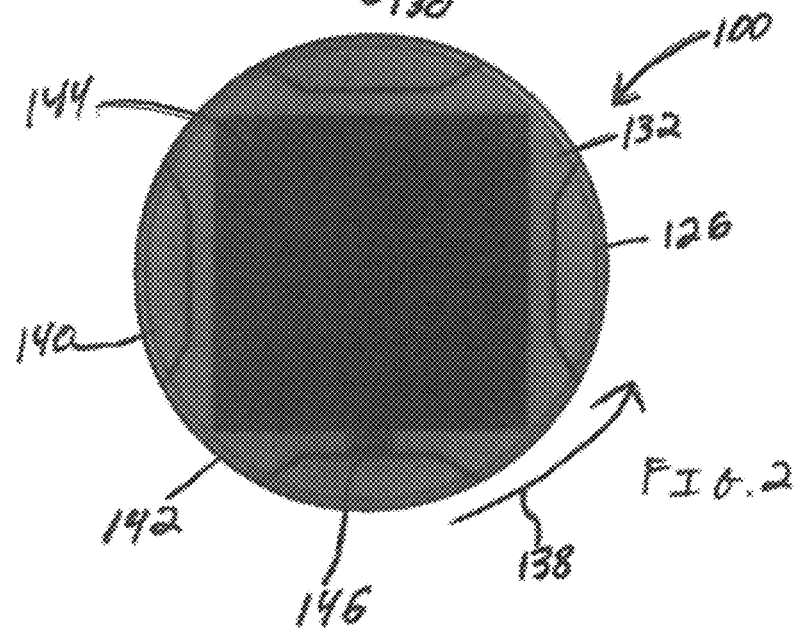
FIG. 2 is a top view of the solar assembly shown in FIG. 1.

FIG. 2 is a top view of the solar assembly 100. The solar panel housing 132 is positioned within the solar panel receptacle 126. The solar panel receptacle 126 includes an outer circumference 138. Receptacle coupling mechanisms 140 are positioned around the outer circumference 138 of the solar panel receptacle 126. The illustrated embodiment includes four receptacle coupling mechanisms 140 equally spaced about the outer circumference 138 of the solar panel receptacle 126. Alternatively, the solar panel receptacle 126 may include any number of receptacle coupling mechanisms 140. The solar panel housing 132 includes housing coupling mechanisms 142 extending outward therefrom. The housing coupling mechanisms 142 are positioned between adjacent receptacle coupling mechanisms 140 to secure the solar panel housing 132 to the solar panel receptacle 126. In one embodiment, the receptacle coupling mechanisms 140 are non-uniformly spaced so that the solar panel housing 132 is only capable of being coupled to the solar panel receptacle 126 in a single orientation.

The solar panel housing 132 includes a solar panel 144 positioned thereon. The solar panel 144 is electrically coupled to a rechargeable battery 145 (shown in phantom) positioned within the solar panel housing 132. In one embodiment, the solar panel housing 132 may include any number of batteries 145. The solar panel 144 converts solar energy into electrical energy. The electrical energy is stored in the rechargeable battery 145. The electrical energy is configured to power the solar assembly 100. When the solar panel housing 132 is electrically coupled to the solar panel receptacle 126, the solar panel 144 and the battery 145 are electrically coupled to the plurality of LEDs 112 (shown in FIG. 1). The plurality of LEDs 112 are powered by the electrical energy stored in the battery 145. A switch 146 is provided on the solar panel housing 132 to operate the solar panel assembly 100. In one embodiment, the switch 146 is configured to turn the LEDs 112 on and off. Alternatively, the switch 146 may also be utilized to select a portion of LEDs 112 to turn on or off. For example, in an embodiment having LEDs 112 with multiple colors, the switch 146 may be used to select a particular color.

Figure 3:
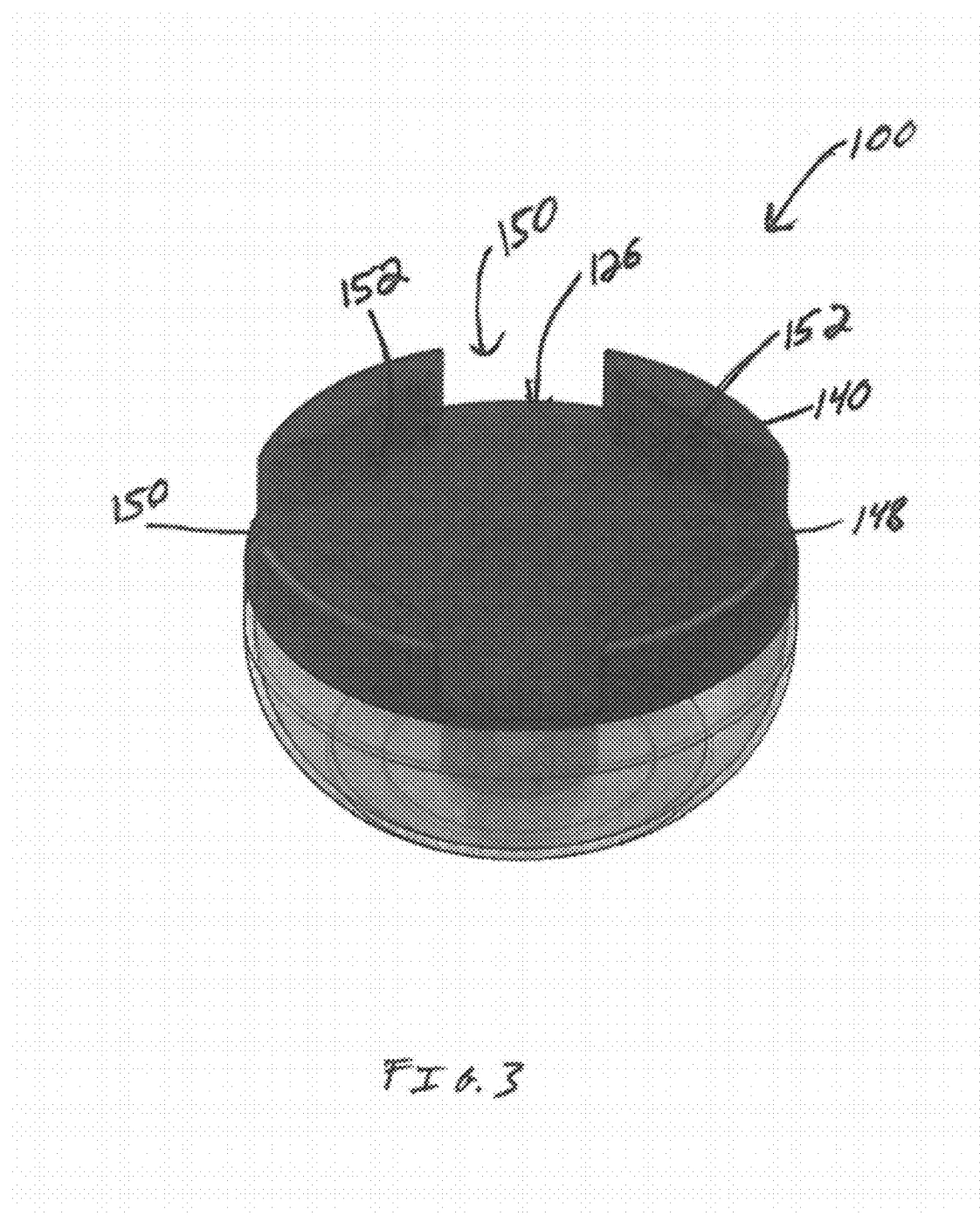
FIG. 3 is a top perspective view of the solar assembly shown in FIG. 1 and having the solar panel housing removed.

FIG. 3 is a top perspective view of the solar assembly 100 with the solar panel housing 132 (shown in FIG. 2) removed. The solar panel receptacle 126 includes a top surface 148. The solar panel housing 132 is configured to be positioned on the top surface 148 of the solar panel receptacle 126. The receptacle coupling mechanisms 140 are formed as tabs that extend from the top surface 148 of the solar panel receptacle 126. A recess 150 is formed between adjacent receptacle coupling mechanisms 140. The recesses 150 are configured to receive the housing coupling mechanisms 142 (shown in FIG. 2) of the solar panel housing 132. The housing coupling mechanisms 142 are secured between adjacent receptacle coupling mechanisms 140 to retain the solar panel housing 132 on the solar panel receptacle 126.

Each receptacle coupling mechanism 140 includes a receptacle contact 152. The receptacle contacts 152 are formed from a conductive material, for example, copper. The receptacle contacts 152 are electrically coupled to the plurality of LEDs 112. In alternative embodiments, the receptacle contacts 152 may be positioned at any location on the solar panel receptacle 126 that is configured to contact the solar panel housing 132.

Figure 4:
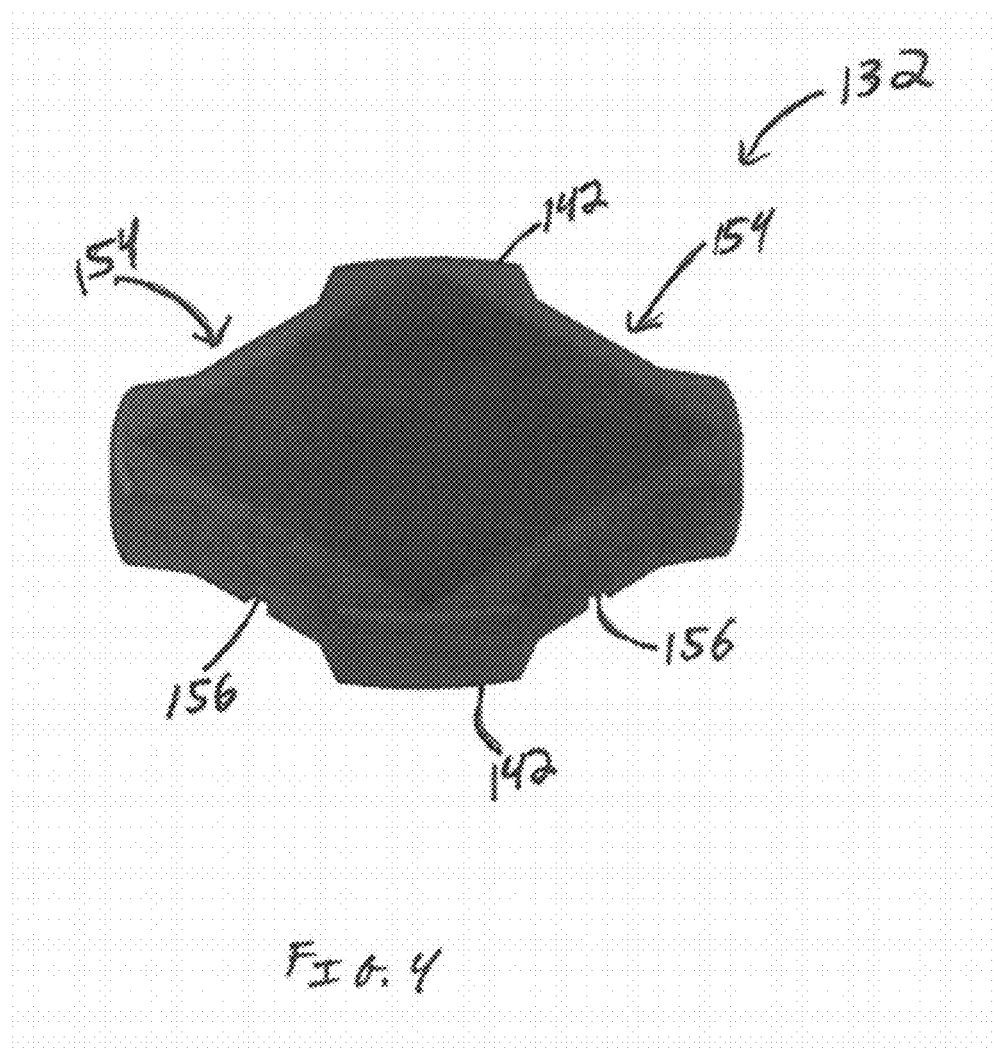
FIG. 4 is a top perspective view of a solar panel housing formed in accordance with an embodiment.

FIG. 4 is a top perspective view of a solar panel housing 132. The housing coupling mechanisms 142 extend outward from the solar panel housing 132. The housing coupling mechanisms 142 are sized to be positioned in the recesses 150 (shown in FIG. 3) formed in the solar panel receptacle 126 (shown in FIG. 3). The number of housing coupling mechanisms 142 corresponds to the number or recesses 150 formed in the solar panel receptacle 126. A recess 154 is formed between each housing coupling mechanism 142. The recesses 154 are sized to receive the receptacle coupling mechanisms 140 (shown in FIG. 3) of the solar panel receptacle 126. The number of recesses 154 in the solar panel housing 132 corresponds to the number of receptacle coupling mechanisms 140 in the solar panel receptacle 126.

Each housing recess 154 includes a housing contact 156. The housing contacts 156 are formed from a conductive material, for example, copper. The housing contacts 156 are electrically coupled to the battery 145 and the solar panel 144. In alternative embodiments, the housing contacts 156 may be positioned at any location on the solar panel housing 132 that is configured to contact the solar panel receptacle 126.

Figure 5:
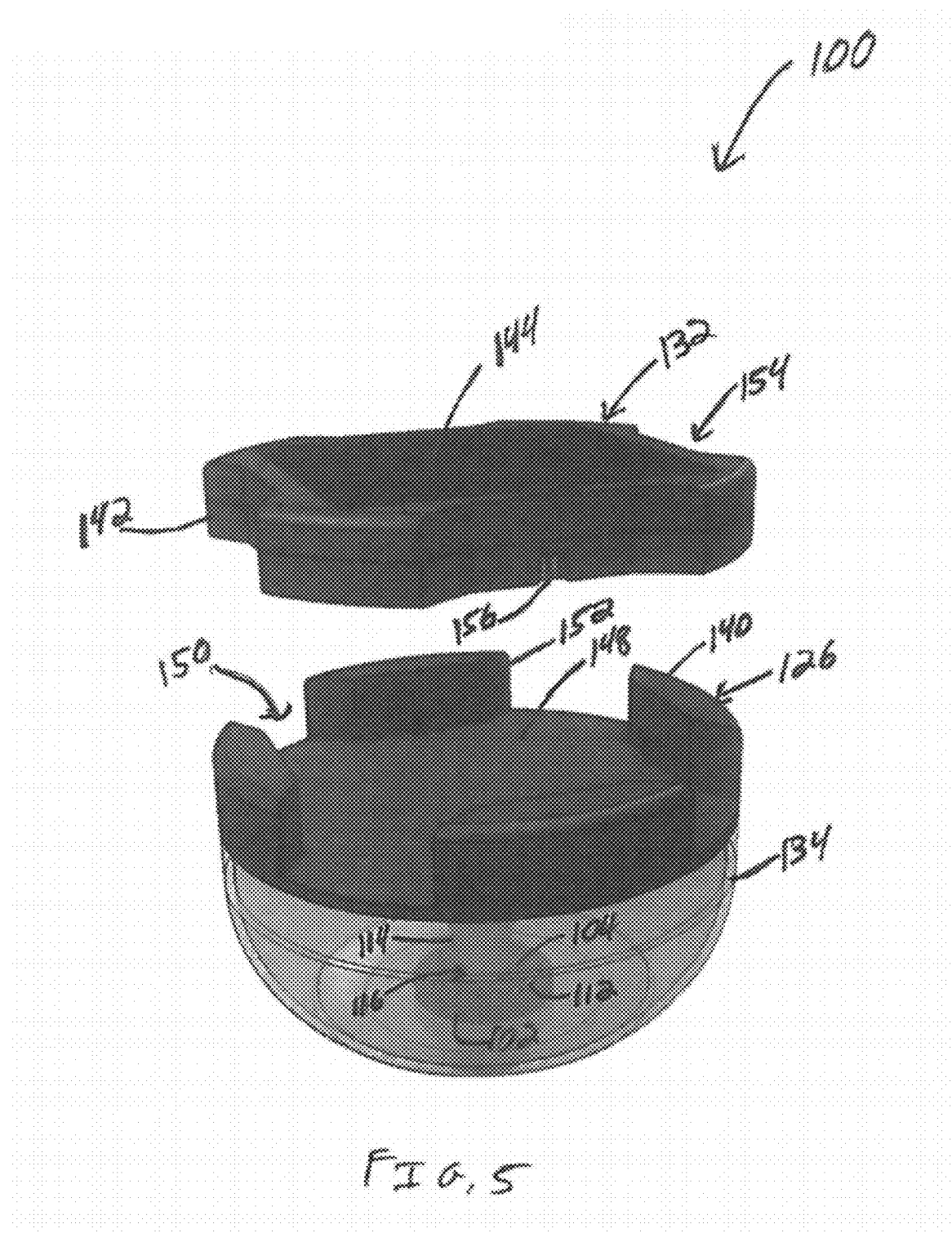
FIG. 5 is an exploded view of the solar assembly shown in FIG. 1.

FIG. 5 is an exploded view of the solar assembly 100. The LEDs 112 are positioned in a circle around the top 104 of the base 102. In alternative embodiments, the LEDs 112 may be positioned in any configuration on the top 104 of the base 102. In one embodiment, the base 102 may include any number of LEDs 112. In another embodiment, the bottom 106 (shown in FIG. 1) of the base 102 may also include at least one LED 112. The LEDs 112 are positioned around the first end 116 of the illumination panel 114. The globe 134 extends around the LEDs 112 and the illumination panel 114. It should be noted that although the LEDs 112, illumination panel 114, and the globe 134 are illustrated having circular cross-sections, the LEDs 112, illumination panel 114, and the globe 134 may be arranged in any configuration.

In the illustrated embodiment, the solar panel housing 132 is removed from the solar panel receptacle 126. The solar panel housing 132 is aligned with the solar panel receptacle 126 and configured to be coupled thereto. The recesses 154 of the solar panel housing 132 are aligned with and configured to receive the receptacle coupling mechanisms 140. The recesses 150 of the solar panel receptacle 126 are aligned with and configured to receive the housing coupling mechanisms 142. The solar panel housing 132 is configured to be positioned on the top surface 148 of the solar panel receptacle 126. The housing contacts 156 are aligned with the receptacle contacts 152. When the solar panel housing 132 is positioned on the solar panel receptacle 126, the housing contacts 156 engage the receptacle contacts 152. The housing contacts 156 engage the receptacle contacts 152 to electrically couple the solar panel 144 and the battery 145 to the plurality of LEDs 112.

The solar panel housing 132 removably couples to the solar panel receptacle 132. Accordingly, the solar assembly 100 is capable of being used in any location. For example, the solar assembly 100 may be used indoors. If the battery 145 becomes drained, the solar panel housing 132 may be positioned outdoors to recharge the battery 145. The entire solar assembly 100 does not have to be moved outdoors to recharge the battery 145. As such, the battery 145 may be charged remotely from the solar panel receptacle 126 and the remainder of the solar assembly 100. In another embodiment, the solar assembly 100 may be provided with multiple solar panel housings 132. In such an embodiment, one solar panel housing 132 may be used to power the solar assembly 100, while a second solar panel housing 132 is charged outdoors. The solar assembly 100 provides more versatile uses for solar lighting. The solar assembly 100 is not limited to use outdoors. The solar assembly 100 enables solar lighting to be utilized indoors.

Figure 6:
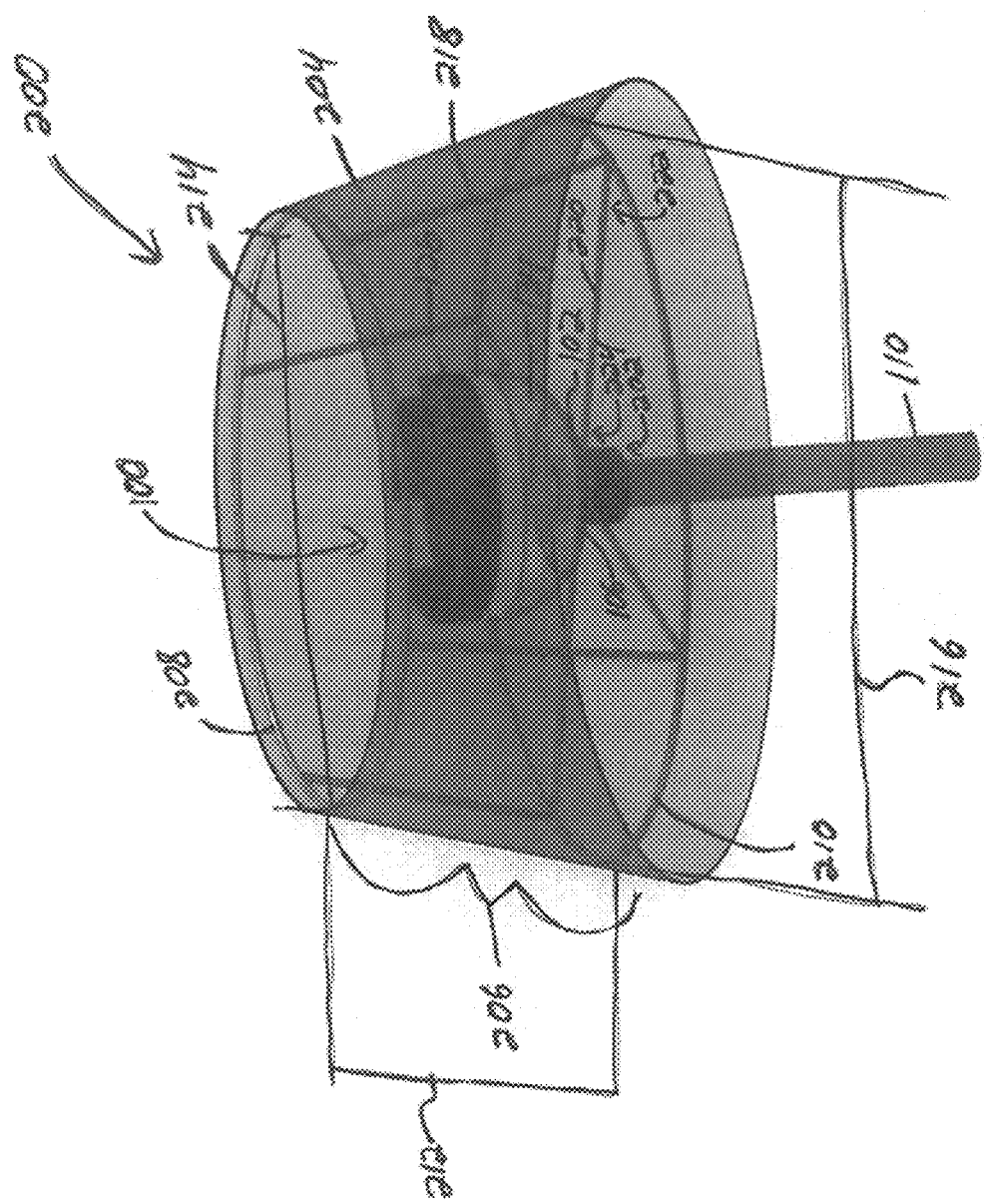
FIG. 6 is a side perspective view of a solar powered lamp formed in accordance with an embodiment.

FIG. 6 is a side perspective view of a solar powered lamp 200 formed in accordance with an embodiment. The solar powered lamp 200 includes the solar assembly 100. The solar assembly 100 is coupled to a stand 110. The stand 110 includes a top end 202. The bottom 106 of the base 102 of the solar assembly 100 is coupled to the top end 202 of the stand 110. The top end 202 of the stand 110 may be hollow and configured to receive the post 108 (shown in FIG. 1) extending from the bottom 106 of the base 102 of the solar assembly 100. The post 108 is threaded and may be configured to be screwed into threads formed within the top end 202 of the stand 110. Alternatively, the post 108 may be retained within the top end 202 of the stand 110 through an interference fit and/or any other suitable coupling mechanism.

A shade 204 is positioned around the solar assembly 100. The shade 204 extends around the base 102 and the solar panel receptacle 126. The shade 204 also extends around the globe 134. The shade 204 is supported by a frame 206. The frame 206 includes a first end 208 and a second end 210. The first end 208 and the second end 210 are arranged in circles. The first end 208 and the second end 210 may be arranged in any suitable shape in alternative embodiments. The first end 208 and the second end 210 are spaced a distance 212. The first end 208 has a first diameter 214 and the second end 210 has a second diameter 216 that is greater than the first diameter 214. Optionally, the first diameter 214 may be greater than or equal to the second diameter 216. Posts 218 extend between the first end 208 and the second end 210. The posts 218 extend the distance 212 between the first end 208 and the second end 210. The posts 218 space the first end 208 from the second end 210. The illustrated embodiment includes four posts 218. Alternatively, the frame 206 may include any number of posts 218. The shade 204 is coupled to the first end 208 and the second end 210. The shade 204 may also be coupled to the posts 218.

Support members 220 extend inward from the second end 210. The illustrated embodiment includes four support members 220. Optionally, the frame 206 may include any number of support members 220. The support members 220 include a frame end 222 and a mounting end 224. The frame end 222 of each support member 220 is coupled to the second end 210 of the frame 206. The frame end 222 of each support member 220 is coupled to the second end 210 proximate to the location where the posts 218 couple to the second end 210. In alternative embodiments, the support members 220 may couple to any location of the second end 210. The mounting end 224 of each support member 220 is coupled to the stand 110. The mounting end 224 of each support member 220 is coupled to the stand 110 proximate to the base 102 of the solar assembly 100.

Figure 7:
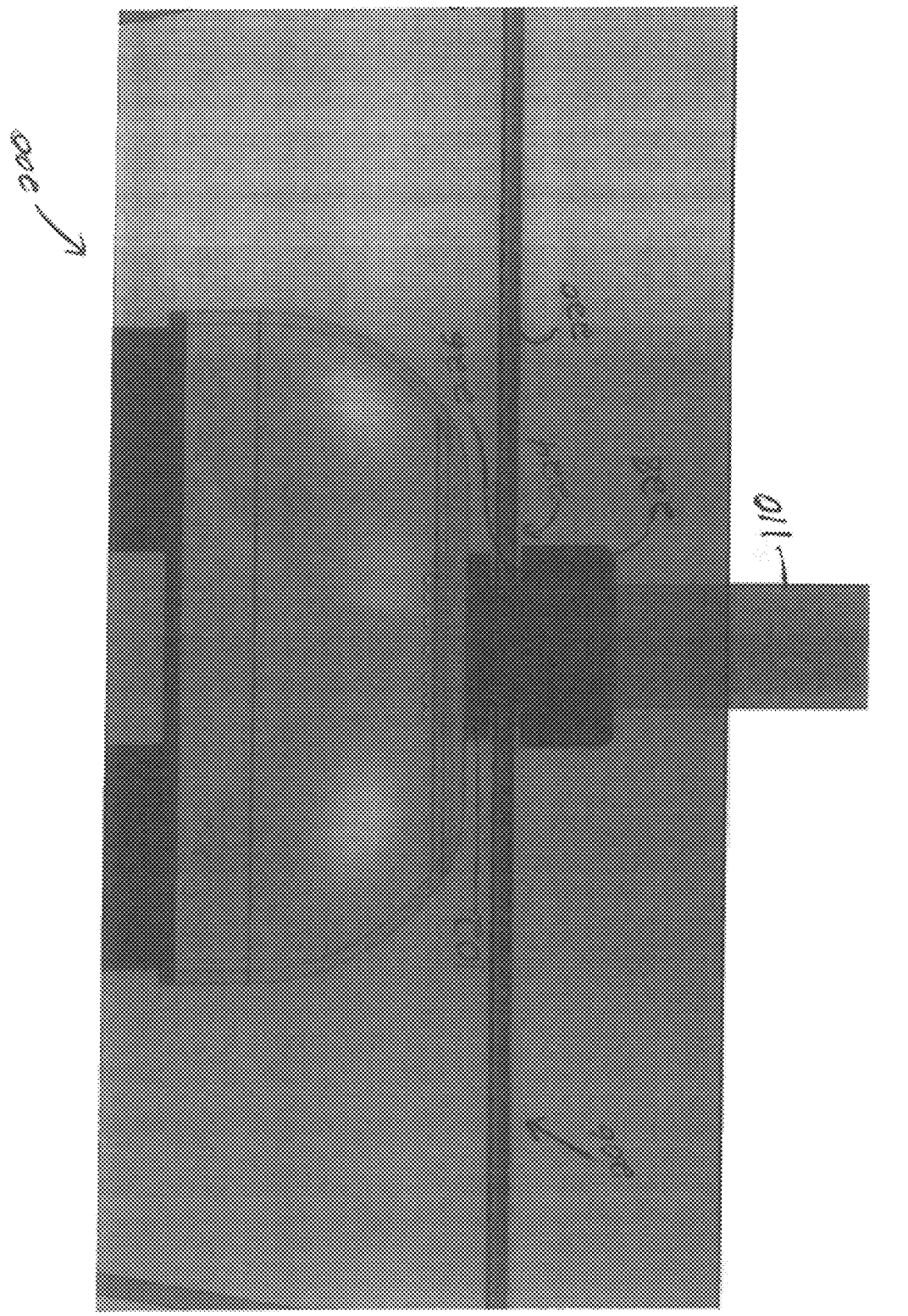
FIG. 7 is a side view of the solar powered lamp shown in FIG. 6.

FIG. 7 is a side view of the solar powered lamp 200. The frame 206 includes a ring 226. The mounting end 224 of each support member 220 is joined to the ring 226. The ring 226 is sized to be positioned around the stand 110. A nut 228 is positioned at the top end 202 of the stand 110. The nut 228 is threaded and screwed onto the threaded post 108 (shown in FIG. 1) of the base 102 of the solar assembly 100. The ring 226 is secured between the nut 228 and the base 102 of the solar assembly 100.

During assembly, the ring 226 of the frame 206 is positioned on the top end 202 of the stand 110. The ring 226 is positioned above the nut 228. The solar assembly 100 is then secured to the top end 202 and the stand 110. The post 108 of the solar assembly 100 is screwed into the top end 202 of the stand 110. The post 108 is screwed into the nut 228 to secure the solar assembly 100 to the stand 110. The ring 226 is secured between the base 102 of the solar assembly 100 and the nut 228. The ring 226 is secured so that the shade 204 is retained around the solar assembly 100.

FIG. 8 is a top perspective view of another solar panel housing 300 that may be used with the solar panel assembly shown in FIG. 1. FIG. 9 is a top perspective view of a solar panel receptacle 302 that may be utilized with the solar panel housing 300 shown in FIG. 8. The solar panel housing 300 is positioned within the solar panel receptacle 302. The solar panel receptacle 302 includes a plurality of coupling mechanisms 304 that are positioned around an outer circumference 306 of the solar panel receptacle 302. The illustrated embodiment includes four receptacle coupling mechanisms 304 equally spaced about the outer circumference 306 of the solar panel receptacle 302. Alternatively, the solar panel receptacle 302 may include any number of receptacle coupling mechanisms 304. The solar panel housing 300 includes a plurality of housing coupling mechanisms 310 extending outward therefrom. The housing coupling mechanisms 310 are positioned between adjacent receptacle coupling mechanisms 304 to secure the solar panel housing 300 to the solar panel receptacle 302. In one embodiment, the receptacle coupling mechanisms 310 are non-uniformly spaced so that the solar panel housing 300 is only capable of being coupled to the solar panel receptacle 302 in a single orientation.

The solar panel housing 300 also includes a single electrical contact 320 that is formed from a conductive material, for example, copper. The contact 320 is electrically coupled to a battery and a solar panel, such as for example, the battery 145 and the solar panel 144 described above. Moreover, the solar panel receptacle includes a single receptacle contact 322 that is configured to align with the contact 320. More specifically, when the solar panel housing 300 is positioned on the solar panel receptacle 302, the housing contact 320 engages the receptacle contact 322. The housing contact 320 engages the receptacle contact 322 to electrically couple the solar panel 144 and the battery 145 to the plurality of LEDs 112. In operation, utilizing a single set of contacts 320 and 322 to couple the solar panel housing 300 to the solar panel receptacle 322 simplifies the electrical connection between the two components, facilitates reducing the fabrication costs of the light assembly, and also increases the water resistance of the light assembly.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the invention without departing from their scope. While the dimensions and types of materials described herein are intended to define the parameters of the various embodiments of the invention, the embodiments are by no means limiting and are exemplary embodiments. Many other embodiments will be apparent to those of skill in the art upon reviewing the above description. The scope of the various embodiments of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments of the invention, including the best mode, and also to enable any person skilled in the art to practice the various embodiments of the invention, including making and using any devices or systems and performing any incorporated methods. The patentable scope of the various embodiments of the invention is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal languages of the claim.

What is claimed is:

1. A solar assembly comprising:
   a base;
   at least one LED coupled to the base;
   an illumination panel having a first end and a second end, the first end coupled to the base, the illumination panel extending from the base between the first end and the second, the illumination panel reflecting light emitted from the at least one LED;
   a solar panel receptacle positioned at the second end of the illumination panel; and
   a solar panel housing removably attached to the solar panel receptacle, the solar panel housing having a solar panel to power the at least one LED.

2. The solar assembly of claim 1 further comprising a battery positioned within the solar panel housing and electrically coupled to the solar panel, wherein the solar panel housing is removable from the solar panel receptacle to charge the battery remotely from the solar panel receptacle.

3. The solar assembly of claim 1, wherein the solar panel receptacle includes a receptacle contact and the solar panel housing includes a housing contact, the receptacle contact engaging the housing contact to electrically couple the solar panel to the at least one LED.

4. The solar assembly of claim 1, wherein the solar panel receptacle includes a receptacle coupling mechanism and the solar panel housing includes a housing coupling mechanism, the receptacle coupling mechanism engaging the housing coupling mechanism to secure the solar panel housing to the solar panel receptacle.

5. The solar assembly of claim 1 further comprising a plurality of LEDs positioned around the first end of the illumination panel.

6. The solar assembly of claim 1, wherein the illumination panel has a parabolic shape.

7. The solar assembly of claim 1, wherein the first end of the illumination panel has a first diameter and the second end of the illumination panel has a second diameter that is greater than the first diameter.

8. The solar assembly of claim 1 further comprising a globe extending between the base and the solar panel receptacle, the globe positioned around the illumination panel.

9. The solar assembly of claim 1 further comprising a shade extending from the base, the shade extending around the base and the solar panel receptacle.

10. The solar assembly of claim 1, wherein the base is configured to couple to a stand.

11. A solar assembly comprising:
a base configured to be coupled to a stand;
a globe extending from the base, the globe having a first end joined to the base and a second end positioned distally from the base;
a solar panel receptacle coupled to the second end of the globe so that the globe defines a cavity between the base and the solar panel receptacle;
at least one LED coupled to the base within the cavity, the at least one LED configured to direct light into the cavity; and
a solar panel housing removably attached to the solar panel receptacle, the solar panel housing having a solar panel to power the at least one LED.

12. The solar assembly of claim 11 further comprising a battery positioned within the solar panel housing and electrically coupled to the solar panel, wherein the solar panel housing is removable from the solar panel receptacle to charge the battery remotely from the solar panel receptacle.

13. The solar assembly of claim 11, wherein the solar panel receptacle includes a receptacle contact and the solar panel housing includes a housing contact, the receptacle contact engaging the housing contact to electrically couple the solar panel to the at least one LED.

14. The solar assembly of claim 11, wherein the solar panel receptacle includes a receptacle coupling mechanism and the solar panel housing includes a housing coupling mechanism, the receptacle coupling mechanism engaging the housing coupling mechanism to secure the solar panel housing to the solar panel receptacle.

15. The solar assembly of claim 11 further comprising an illumination panel extending between the base and the solar panel receptacle, the illumination panel reflecting light emitted from the at least one LED.

16. The solar assembly of claim 15 further comprising a plurality of LEDs positioned around the illumination panel.

17. The solar assembly of claim 11 further comprising a shade extending from the base, the shade extending around the globe.

18. A solar powered lamp comprising:
a stand;
a base having a top and a bottom, the bottom of the base coupled to the stand;
an illumination panel having a first end and a second end, the first end coupled to the top of the base;
at least one LED positioned on the top of the base, the illumination panel reflecting light from the at least one LED;
a solar panel receptacle coupled to the second end of the illumination panel; and
a solar panel housing removably attached to the solar panel receptacle, the solar panel housing having a solar panel to power the at least one LED.

19. The solar powered lamp of claim 18 further comprising a battery positioned within the solar panel housing and electrically coupled to the solar panel, wherein the solar panel housing is removable from the solar panel receptacle to charge the battery remotely from the solar panel receptacle.

20. The solar powered lamp of claim 18 further comprising a globe extending between the base and the solar panel receptacle, the globe defining a cavity between the base and the solar panel receptacle, the illumination panel positioned within the cavity, the at least one LED directing light into the cavity.

* * * * *